United States Patent [19]
Ochii et al.

[11] Patent Number: 4,616,148
[45] Date of Patent: Oct. 7, 1986

[54] SENSE AMPLIFIER

[75] Inventors: Kiyofumi Ochii, Yokohama; Hiroshi Yasuda, Tokyo; Fujio Masuoka, Yokohama, all of Japan

[73] Assignee: Kabushiki Kaisha Toshiba, Tokyo, Japan

[21] Appl. No.: 792,854

[22] Filed: Oct. 30, 1985

[30] Foreign Application Priority Data

Oct. 31, 1984 [JP] Japan ................................ 59-229246

[51] Int. Cl.⁴ ...................... H03K 5/24; H03K 3/023; H03K 3/356; G11C 7/06
[52] U.S. Cl. .................................. 307/530; 307/279; 307/290; 365/205; 365/208
[58] Field of Search .............. 307/530, 355, 362, 279, 307/290; 365/205, 207, 208

[56] References Cited

U.S. PATENT DOCUMENTS

| | | | |
|---|---|---|---|
| 3,873,856 | 3/1975 | Gerlach et al. | 307/290 X |
| 3,983,412 | 9/1976 | Roberts et al. | 307/530 |
| 4,003,035 | 1/1977 | Hoffman | 307/530 X |
| 4,169,233 | 9/1979 | Haraszti | 307/355 |
| 4,170,741 | 10/1979 | Williams | 307/355 |
| 4,511,810 | 4/1985 | Yukawa | 307/530 X |
| 4,567,389 | 1/1986 | Tran | 307/530 |

OTHER PUBLICATIONS

Iizuka, "Fully Static 16Kb Bulk CMOS RAM"; *IEEE ISSCC 1980;* 2/15/80; *Digest of Technical Papers, pp. 226-227, 277.*
Towler, "Low Input Capacitance Sense Amplifier"; *IBM-TDB;* vol. 26, No. 7A, pp. 3124-3125; 12/1983.
Chin et al., "Low-Power Data Register"; *IBM-TDB;* vol. 15, No. 12, pp. 3891-3892; 5/1973.
Gschwendtner et al., "Sense System"; *IBM TDB;* vol. 16, No. 12, pp. 3960-3961; 5/1974.

*Primary Examiner*—Larry N. Anagnos
*Attorney, Agent, or Firm*—Finnegan, Henderson, Farabow, Garrett & Dunner

[57] ABSTRACT

A sense amplifier in use for a memory device is made up of a pair of Schmitt trigger circuits. These Schmitt trigger circuits are cross coupled with each other so that each of the Schmitt trigger circuits operates in response to a predetermined high potential difference. The predetermined potential difference is high enough to operate each Schmitt trigger circuit according to the steeper slope of the two long slopes of a hysteresis loop of the Schmitt trigger circuit.

6 Claims, 14 Drawing Figures

F I G. 10
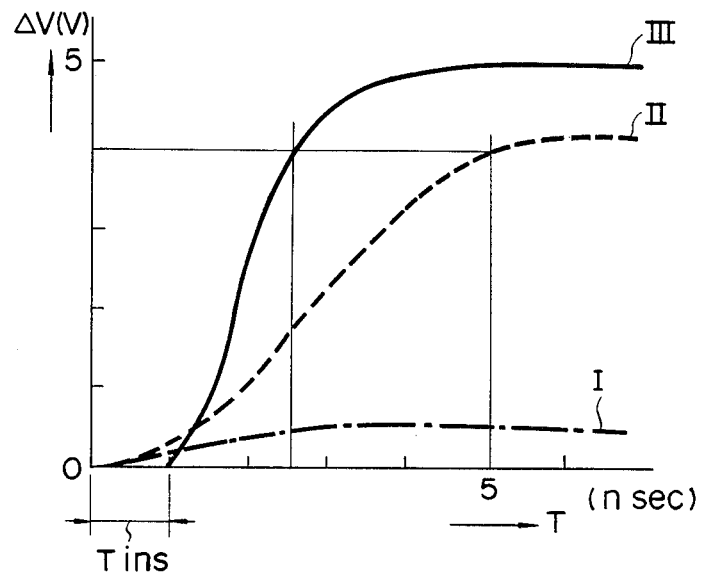
F I G. 11
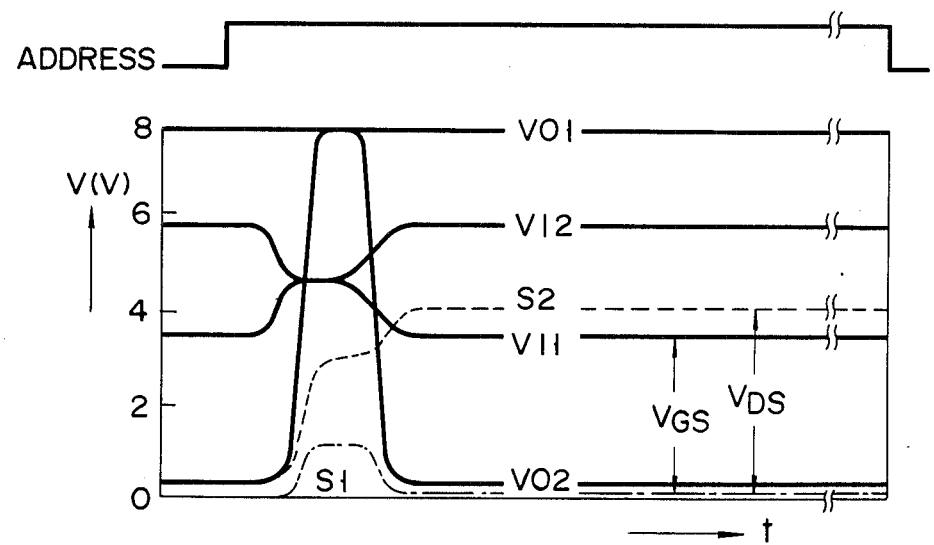

4,616,148

SENSE AMPLIFIER

BACKGROUND OF THE INVENTION

This invention relates to a sense amplifier circuit to be used by a MOS (metal oxide semiconductor) memory device.

In a MOS semiconductor memory device, a minute potential difference appears between each pair of bit lines in a read out mode of the memory device. The minute potential difference must be amplified to a satisfactory level. To amplify this potential difference, a differential amplifier is usually used. The use of a differential amplifier, however, involves some problems, typically, considerable time required for the amplification, and unsatisfactory reliability of the amplifier.

For a better understanding of the prior art problems, a mirror load type differential amplifier, which has widely been used as the sense amplifier will be given referring to FIG. 1. The differential amplifier comprises a pair of mirror load type amplifier sections $7_1$ and $7_2$. The amplifier section $7_1$ is made up of a differential amplifier circuit $3_1$ and a current mirror circuit $6_1$ serving as a load for the amplifier circuit $3_1$. The amplifier section $7_2$ is similarly made up of a differential amplifier circuit $3_2$ and a current mirror circuit $6_2$ serving as a load for the amplifier circuit $3_2$. The amplifier circuits $3_1$ and $3_2$ comprise respectively pairs of n-channel MOS transistors $1_1$ and $2_1$, and $1_2$ and $2_2$. The load circuits $6_1$ and $6_2$ comprise respectively pairs of p-channel transistors $4_1$ and $4_2$, and $5_1$ and $5_2$. An n-channel MOS transistor $8_1$ is provided with the current path connected at one end to a junction S between the sources of the transistors $1_1$ and $2_1$, and at the other end to the reference potential VSS. The gate of the transistor $8_1$ is coupled to a chip enable signal CE. The n-channel MOS transistor $8_2$ is similarly connected in the differential amplifier section $7_1$. These transistors $8_1$ and $8_2$ serve as switching elements. An input voltage VI1 to the mirror load type differential amplifier is input to the gates of the transistors $1_1$ and $2_1$. An input voltage VI2 is input to the gates of the transistors $1_2$ and $2_2$. Output voltages VO1 and VO2 are derived from the junctions between the transistors $1_1$ and $4_1$, and $1_2$ and $4_2$, respectively. VDD indicates a positive power source potential. VSS a reference potential, for example, a ground potential.

The operation of the mirror load type differential amplifier thus constructed is as graphically illustrated in FIG. 2. The time td1 taken from the starting point of a potential difference ΔVI till the output potential difference ΔVO starts is very short. That is, this amplifier amplifies the input potential difference ΔVI at a very high speed. An amplification factor of this type amplifier, however, is small. The amplitude, however, of the output signal ΔVO of the amplifier is unsatisfactory. To cope with the problem, a plurality of the mirror load type amplifiers are arranged in a cascade fashion. This approach successfully solves the amplification factor problem, but creates another problem of the amplification speed. Signal delays of the respective amplifier stages are accumulated, so that the amplifying speed of the whole amplifier is low.

A graph shown in FIG. 3 illustrates variations of the input and output voltages VI1, VI2, VO1 and VO2, and a potential at the junction S in each mirror load differential amplifier section $7_1$ and $7_2$, in comparison with a waveform of an address signal. As shown, a drain-source voltage VDS or VO1, of the transistor $1_1$ or a drain-source voltage VDS, or VO1 of the transistor $1_2$ reaches about 8 V of the power source voltage VDD. FIG. 4 illustrates the relationship between the drain-source voltage VDS and the gate-source voltage VGS of the transistor of the differential amplifier circuit in each amplifier section. As seen from this figure, the maximum drain-source voltage VDS near 8 V is located in the critical region RD of the transistor. In this region, a great number of hot carriers are generated. When the transistor is operated in this region, the threshold voltage of the transistor fluctuates and latch-up phenomenon occurs. This results in deterioration of the reliability of the amplifier.

SUMMARY OF THE INVENTION

Accordingly, an object of the present invention is to provide a sense amplifier which can amplify a minute potential at a high speed and with a satisfactory amplification factor.

To achieve the above object, there is provided a sense amplifier comprising a first Schmitt trigger circuit comprising a first MOS transistor of the first polarity connected between a first power source potential and a first output terminal, second and third MOS transistors of the second polarity, the source-drain paths of said second and third MOS transistors being inserted between said first output terminal and a second power source potential, the gates of said second and third MOS transistors being connected together and to a first input terminal to be coupled for reception with a first input potential, and a fourth MOS transistor of the second polarity of which the source-drain path is inserted between said first power source potential and a node between the source-drain paths of said second and third MOS transistors, the gate of said fourth MOS transistor being connected to said first output terminal, a second Schmitt trigger circuit comprising a fifth MOS transistor of the first polarity connected between said first power source potential and a second output terminal, sixth and seventh MOS transistors of the second polarity, the source-drain paths of said sixth and seventh MOS transistors being inserted between said second output terminal and said second power source potential, the gates of said sixth and seventh MOS transistors being connected together and to a second input terminal to be coupled for reception with a second input potential, and an eighth MOS transistor of the second polarity whose source-drain path is inserted between said first power source potential and a node between the source-drain paths of said sixth and seventh MOS transistors, the gate of said eighth MOS transistor being connected to said second output terminal, the gate of said first MOS transistor in said first Schmitt trigger circuit being connected to said node between the source-drain paths of said sixth and seventh MOS transistors, and the gate of said fifth MOS transistor in said second Schmitt trigger circuit being connected to said node between the source-drain paths of said sixth and seventh MOS transistors.

BRIEF DESCRIPTION OF THE DRAWINGS

FIG. 10 shows a graph comparatively illustrating variations of the output potentials of the sense amplifiers of the present invention and prior art;

FIG. 11 shows a graph illustrating variations of the input and output potentials, and potentials at the node S and the node 15A or 15B in the sense amplifier of FIG. 9;

DETAILED DESCRIPTION OF THE PREFERRED EMBODIMENTS

The present invention makes good use of the sharp transient characteristic of a Schmitt trigger circuit for detecting a minute potential difference. To understand the present invention, it is believed, therefore, that the Schmitt trigger circuit must be fully understood. Throughout the accompanying drawings, like or equivalent portions are designated by like reference symbols, for simplicity.

Figure 5:
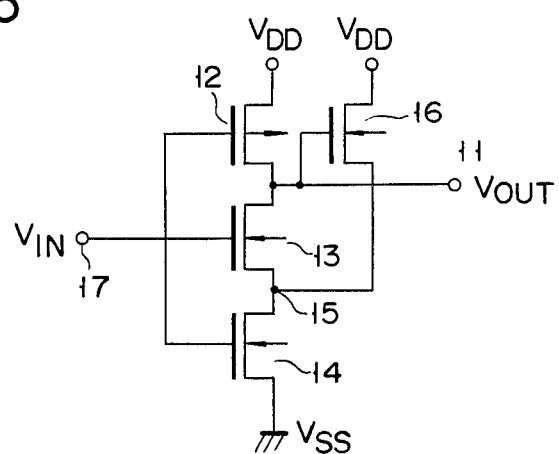
FIG. 5 shows a circuit diagram of an example of a Schmitt trigger circuit, which is for explaining the principle of the present invention.

FIG. 5 shows a known Schmitt trigger circuit using CMOS (complementary metal oxide semiconductor) transistors. The Schmitt trigger circuit is comprised of a p-channel transistor 12, and three n-channel transistors 13 to 15. The source drain paths of the transistors 12 to 14 are connected in series between a positive power source potential VDD and a reference potential VSS, for example, an earth ground potential. The gates of these transistors are connected together to an input terminal Vin. A node between the current paths of the transistors 12 and 13 is connected to the output terminal 11 and the gate of the transistor 16. A node 15 between the current paths of the transistors 13 and 14 is connected to the drain of the transistor 16. The drain of the transistor 16 is connected to the positive power source potential VDD.

Figure 6:
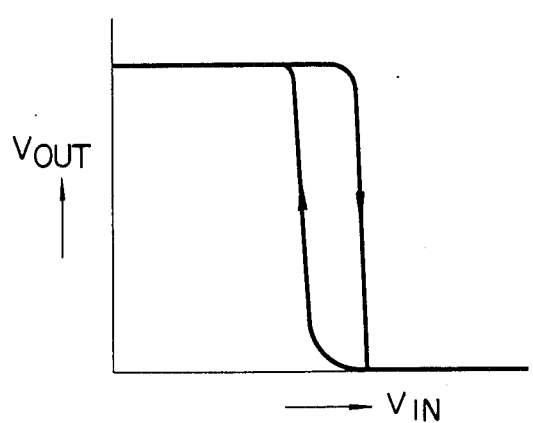
FIG. 6 shows a graph illustrating an input potential to an output potential of the FIG. 5 circuit.

The input/output characteristic of the Schmitt trigger circuit thus arranged is as shown in FIG. 6. When the input potential Vin is at a low potential near the earth ground potential, the p-channel transistor 12 is in an ON state, while the n-channel transistors 13 and 14 are in an OFF state. Accordingly, the output voltage Vout at the output terminal 11 is high and near the power source potential VDD. At this time, the transistor 16 is turned on since its gate receives a high potential equal to the output terminal potential. The turn on of the transistor 16 causes the node 15 between the transistors 13 and 14 to be placed at a high potential near VDD.

It is assumed that the input potential Vin, which is presently low, gradually increases toward VDD. When the increasing input potential Vin is approximately equal to the threshold voltage of each transistor 13 and 14, a signal potential at the output terminal 11, i.e. the output potential Vout, tends to be low. The output potential change to a low, however, is inhibited by the transistor 16 till the input potential Vin reaches that threshold voltage. The reason for this is that, during the period that the potential Vin is increasing toward the threshold voltage, the output potential Vout is still high enough to turn on the transistor 16, and hence the node 15 is kept at a high potential by the transistor 16. As the input potential Vin reaches the threshold voltage, impedance of the current paths of the transistors 13 and 14 are abruptly decreased to a satisfactory low, and the output potential Vout suddenly drops to a low potential.

It is next assumed that the input potential Vin is at a high potential near VDD. Under this condition, the transistor 12 is in the OFF state, while the transistors 13 and 14 are in the ON state. The output potential Vout is set at a low potential near the earth ground potential VSS. The transistor 16 is in the OFF state.

Let us assume that the input potential Vin gradually decreases toward VSS. When the input potential decreases and reaches a value near the threshold voltage at which the transistor 12 is turned on, the output potential Vout rises toward the high potential along a slope representing rates of potential change, which is similar to that of the ordinary CMOS inverter. When the input potential is further decreased, the MOS transistors 13 and 14 are turned off, and the output potential reaches a further higher potential. The high output potential Vout turns on the transistor 16, so that the node 15 between the transistors 13 and 14 is set at a high potential. The output potential Vout abruptly increases toward the power source potential VDD.

As described above, the Schmitt trigger circuit contains some hysteresis in the input to output characteristic. It is noted here that transient curves of the hysteresis loop are much sharper than that of the output potential of the CMOS inverter.

The present invention utilizes this sharp transient characteristic of the Schmitt trigger circuit for detecting the minute potential difference, thereby to improve the amplifying speed.

Figure 7:
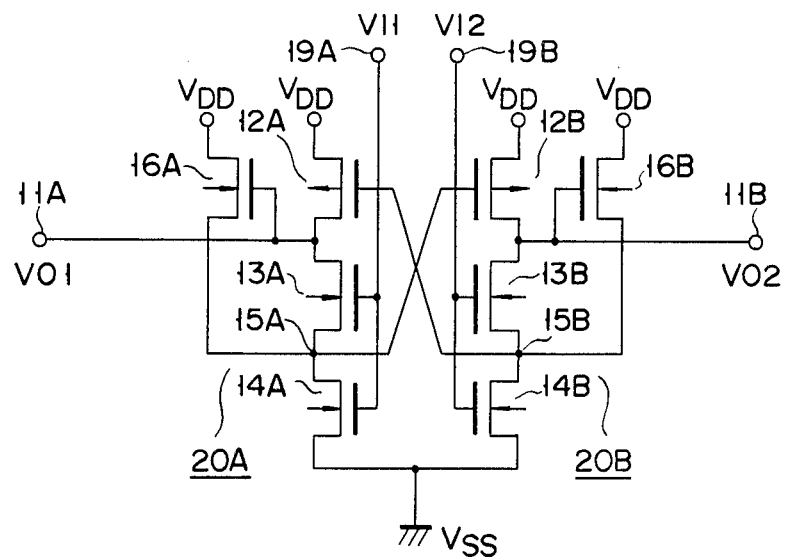
FIG. 7 is a circuit diagram of a sense amplifier according to a first embodiment of the present invention.

A first embodiment of the present invention which implements the above idea is shown in FIG. 7. This embodiment is a sense amplifier. This sense amplifier is comprised of first and second Schmitt trigger circuits 20A and 20B each of which has the same arrangement as that of the Schmitt trigger circuit of FIG. 5, with some exceptions. In FIG. 7, like or equivalent portions are designated by like numerals attached with A or B. The numerals with A indicate those portions in the Schmitt circuit 20A, and those with B, those in the circuit 20B.

As recalled, in the FIG. 5 circuit, the gates of the transistors 12 to 15 are connected together to the input terminal Vin. In this embodiment, the gate of the transistor 12A is connected to the junction 15B of the transistors 13B and 14B, and the gate of the transistor 12B is connected to the junction 15A of the transistors 13A and 14A. The gates of the transistors 13A and 14A are connected together to the input terminal 19A. The gates of the transistors 13A and 13B are connected together to the input terminal 19B.

The other interconnections among the transistors and the terminals, and the polarity of the transistors in each Schmitt trigger circuits 20A and 20B are the same as those of the FIG. 5 circuit.

Considering operation of the first Schmitt trigger circuit 20A, when the p-channel MOS transistor 12A is in the ON state, the potential at the output terminal 11A is high and near the positive power source potential VDD. The ON state of the transistor 12A turns on the n-channel MOS transistor 16A. As a result, the potential at the node 15A between the current paths of the transistors 13A and 14A increases to a high potential near VDD. Thus, the potential at the output voltage VO1 varies proportional to the potential at the node 15A. The same thing is true for the second Schmitt trigger circuit 20B. It is noted that the sense amplifier containing the Schmitt trigger circuits 20A and 20B, which are cross coupled, operates like a latch circuit.

Figure 8:
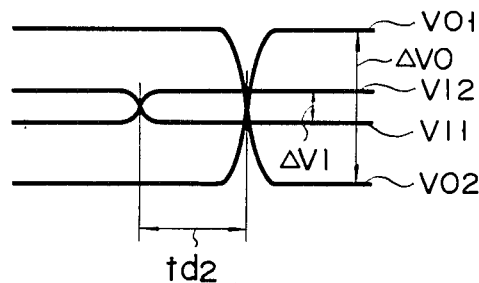
FIG. 8 shows variations of the input and output potentials of the FIG. 7 circuit.

Continuing a further description of the operation of this sense amplifier, data as read out of a specified memory cell of a memory array (not shown) is applied to the input terminals 19A and 19B in the form of the input potentials VI1 and VI2. The sense amplifier receives and amplifies the input potentials, and produces output potentials VO1 and VO2. The flow of this operation is well illustrated in FIG. 8. As seen from the FIG. 8, the output voltages VO1 and VO2 start to rise in absolute value after a time period td2 from the time point when the input voltages VI1 and VI2 increase in absolute value. When the potential difference VI is small, the time td2 is longer than that of the mirror load type differential amplifier of FIG. 1 as the prior art. This arises from the influence of the hysteresis characteristic of the Schmitt trigger circuit. Specifically, when input potential difference ΔVI is small, the output voltage upwardly varies along the gentle transient curve of the hysteresis loop (FIG. 6). Therefore, the distance from the cross point of the curves of the potentials VO1 and VO2 to that of the curves of the potentials VI1 and VI2 is long (FIG. 8). On the other hand, when the input potential difference ΔVI is appropriately high, the output potential downwardly varies along the sharp transient curve of the hysteresis loop (FIG. 6). Therefore, that distance between the cross points is short (FIG. 8). Thus, in this case, the output potential difference rapidly grows, and the time td2 is short. For this reason, the sense amplifier must be operated with such an appropiate input potential difference. The sense amplifier of the present invention has another advantageous feature that the amplitude of the output potential difference is larger than that of the mirror load type differential amplifier of prior art. The reason for this is that, while the prior art operates the transistors in the boundary region between the fully turned on and off states, this embodiment operates them in the fully turned on and off states. Further, since the transient period of each transistor is short, the current flowing during that period is reduced and therefore the power dissipation by the sense amplifier is also reduced. As described above, to operate the sense amplifier shown in FIG. 1 at a high speed, a predetermined high potential is required for the input of the sense amplifier because of its hysteresis characteristic. Practically, however, the potential difference output from the memory is generally extremily small, 0.5 V at most. Therefore, it is almost impossible to amplify such a minute input at a high speed by a single sense amplifier of this embodiment.

Figure 1:
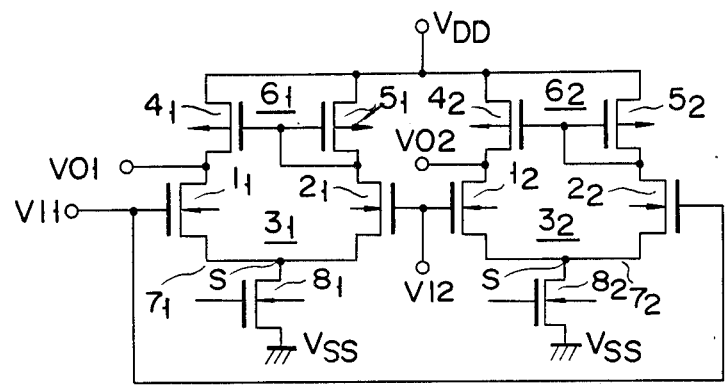
FIG. 1 shows a circuit diagram of a sense amplifier of prior art.
Figure 2:
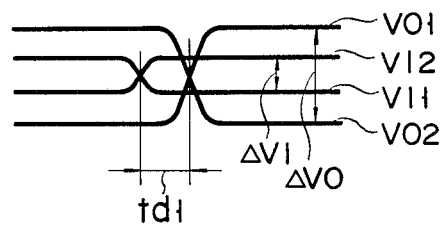
FIG. 2 shows a graph illustrating variations of input potentials and output potentials of the sense amplifier of FIG. 1.
Figure 3:
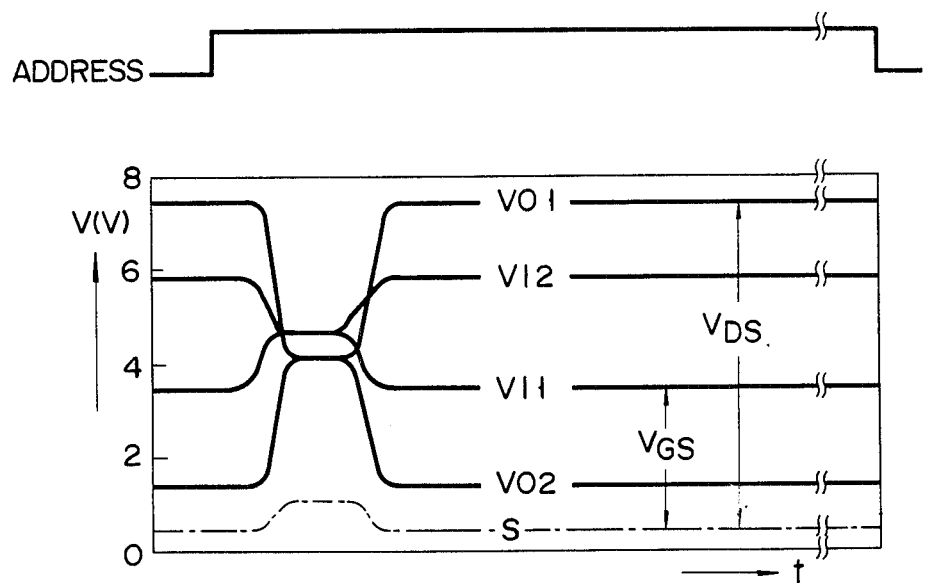
FIG. 3 shows a graph illustrating variations of the input and output potentials, and a potential at the node S of the circuit of FIG. 1 with respect to a variation of an address signal.
Figure 4:
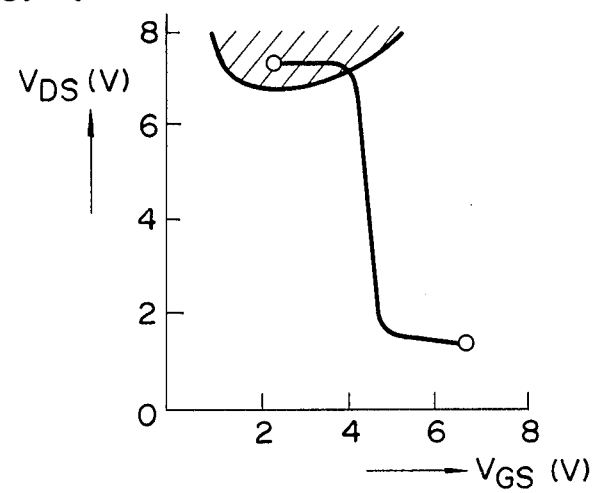
FIG. 4 shows a graph illustrating the input to output characteristic of the FIG. 1 amplifier.
Figure 9:
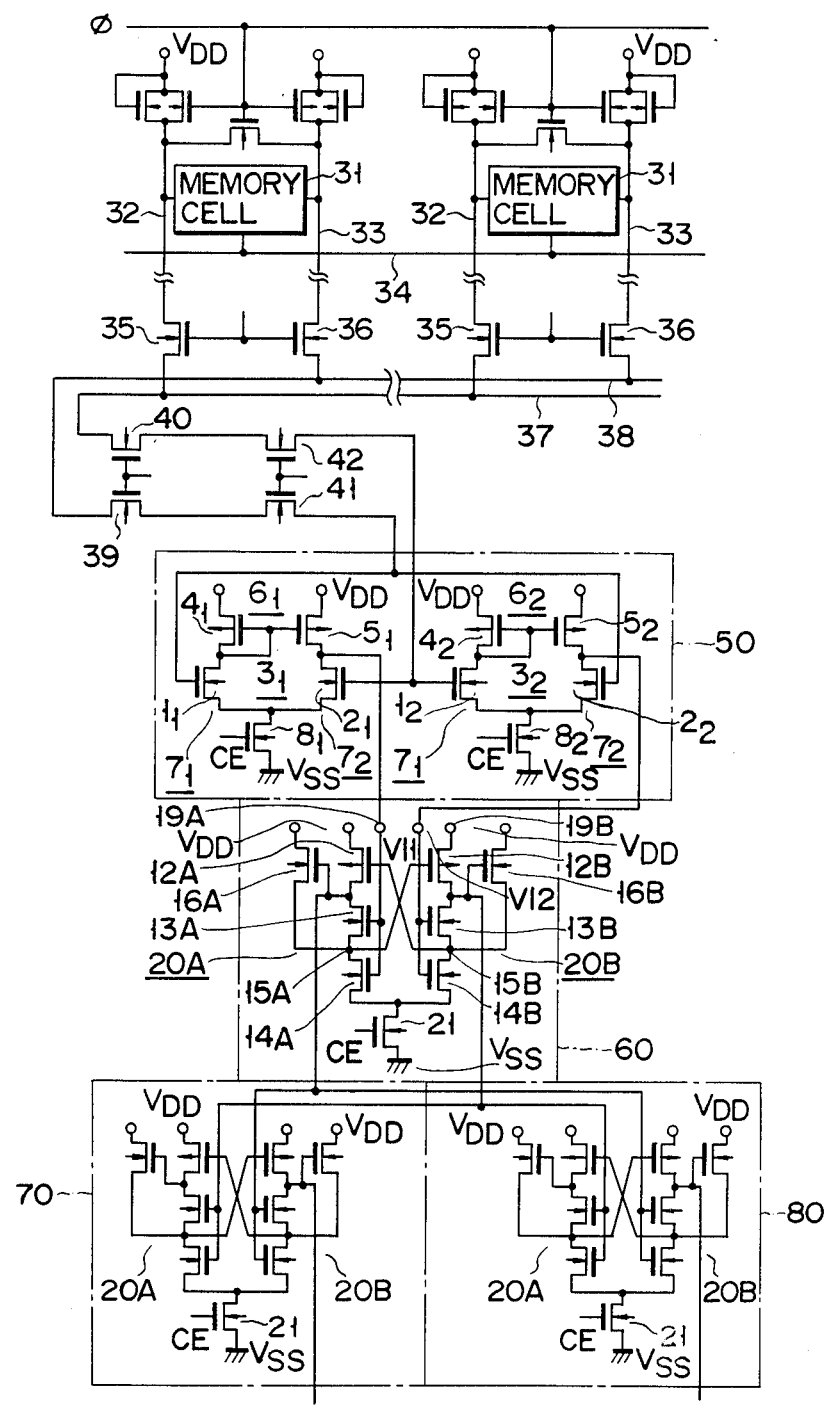
FIG. 9 shows a circuit diagram of a sense amplifier according to a second embodiment of the present invention.

An embodiment of this invention shown in FIG. 9 solves this problem in a manner that a minute input potential difference is amplified by a presense amplifier 50 and then is amplified by a main sense amplifier 60 arranged as mentioned above. As shown, the presense amplifier 50 is a mirror load type differential amplifier as shown in FIG. 1, and amplifies the minute input potential difference output from a specified memory cell 31 in a memory array 30. By this amplifier, the input potential difference is amplified to the predetermined potential, i.e. a value free from the influence of the hysteresis characteristic of the next stage sense amplifier 60. The sense amplifier 60 is arranged as shown in FIG. 7.

To be more specific, the memory array 30 contains memory cells 31. Each memory cell 31 is coupled with its associated paired bit lines 32 and 33. These memory cells 31 are connected together to a word line 34. Address signals derived from the address decoder (not shown) specify a specific memory cell, which in turn produces data as stored therein. The data appears on the paired bit lines 32 and 33 in the form of potential difference. These potential difference is output onto a pair of column output lines 37 and 38, through n-channel MOS transistors 35 and 36 as switching elements which are controlled by an output signal derived from a column decoder (not shown). The potentials on the column output line pair are passed through pairs of n-channel MOS transistors 39 and 40, and 41 and 42 as switching elements to the mirror load type differential amplifier circuit 50. These transistor pairs 39 and 40, and 41 and 42 are switched by the output signal from a section decoder (not shown).

In the differential amplifier circuit 50, the differential pairs $3_1$ and $3_2$ are grounded through n-channel transistors $9_1$ and $9_2$. Each transistor $9_1$ or $9_2$ is connected at the gate to a chip enable signal CE. The current path of each transistor 9 is connected between its associated differential pair and the reference potential VSS. These transistors $9_1$ and $9_2$ are driven by a chip enable signal derived from a circuit (not shown) only when the transistor pairs 39 and 40, and 41 and 42 are driven. When these are not driven, the transistors $9_1$ and $9_2$ are not enabled thereby securing power savings.

The main sense amplifier 60, which is constructed with cross coupled Schmitt trigger circuits 20A and 20B, as shown in FIG. 7, has additionally an n-channel MOS transistor 21 as a switching element. The transistor 21 connects the node of the transistors 14A and 14B to VSS. The only time the main sense amplifier 60 is operated, is when the transistor 21 is enabled by a chip enable signal applied to its gate. The provision of this switching transistor 21 is also provided for saving electric power. In this embodiment, the data as read out and thus amplified must be delivered to a plurality of destinations. To this end, the output of the main sense amplifier 60 is branched to sense amplifiers 70 and 80 each of which has the same circuit arrangement as that of the amplifier 60, as shown. The succeeding amplifiers 70 and 80 serve as buffer amplifiers.

FIG. 10 comparatively shows the output characteristics of the present embodiment of FIG. 9 and the prior art of FIG. 1, and illustrates a variation of the input potential difference. In the graph, the ordinate represents the output potential difference ΔV (V), while the abscissa time T (nsec). Further, the dotted line denoted as I, indicates the variation of the input potential difference VI. A broken line II indi-cates the variation of the output potential difference VO of the prior art. A continuous line III represents a variation of the output potential difference VO of the sense amplifier of the present invention. As seen from the graph, the present embodiment has an insensitive region Tins ranging from time 0 to 1 nsec. The output voltage of this embodiment sharply rises from the end of the insensitive region and reaches approximately 5 V. The time taken for the output voltage of this embodiment to reach 4 V is about 2.4 nsec. On the other hand, the output voltage of the prior art gently rises to a maximum of about 4 V after 5 nsec. It is noted that the maximum output voltage of this embodiment is about 5 V and higher than the 4 V of the prior art, and that the time required for the output voltage of this embodiment to reach 4 V is 2.5 nsec and half of that of the prior art.

Figure 12:
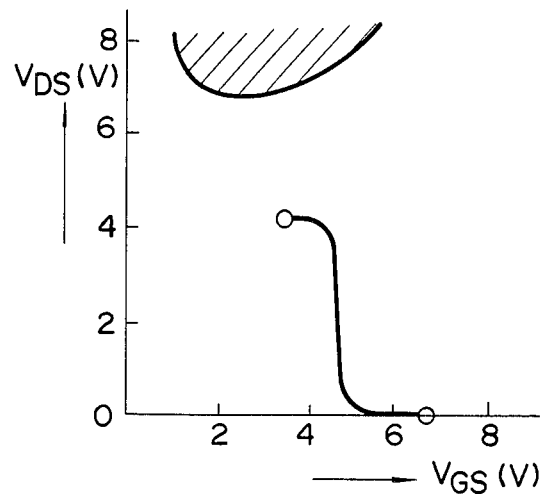
FIG. 12 shows a graph illustrating a gate-source voltage to a drain-source voltage of an output transistor of the FIG. 9 circuit.

FIG. 11 shows variations of the input potentials VI1 and VI2, the output potentials VO1 and VO2, the output voltage of the switching transistor 21, and the drain gate voltage of the output transistor. As seen from FIG. 11, the output voltage of the switching transistors 14A and 14B are maximum of about 4 V, because of the p-channel transistors 16A and 16B, and half of those of the prior art. Therefore, the transistor 14A or 14B operates outside of the critical region RD, as shown in FIG. 12. This indicates that the sense amplifier of this embodiment is free from the prior art problems of the fluctuation of the threshold voltage and latch-up phenomenon.

Figure 13:
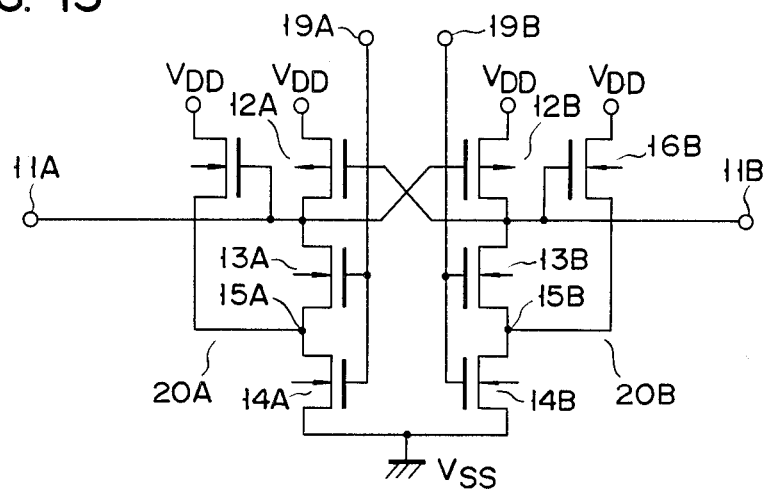
FIGS. 13 and 14 show circuits diagrams of sense amplifiers according to other embodiment of the present invention.
Figure 14:
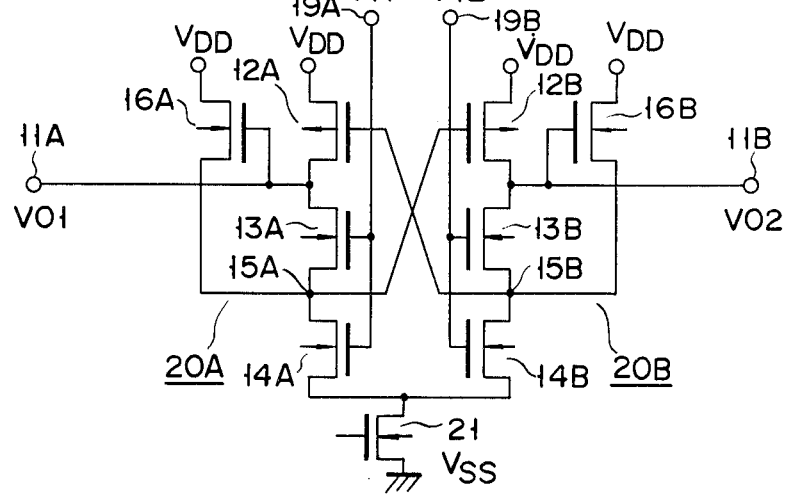

Turning now to FIG. 13, there is shown a modification of the sense amplifier shown FIG. 7. In this modification, the gate of the transistor 12A is connected to the output terminal 11B. Similarly, the gate of the transistor 12B is connected to the output terminal 11A. The remaining circuit arrangement of this modification is the same as that of FIG. 7.

There in shown another modification of the sense amplifier shown in FIG. 7. In this modification, an n-channel MOS transistor 21 is provided between the junction of the drains of transistors 14A and 14B and ground. The gate of the transistor 21 is coupled to a chip evable signal CE.

Further, the mirror load type differential amplifier 50 in the embodiment of FIG. 9 may be replaced by any other suitable amplifier, if it does not contain the hysteresis and the insensitive region in its characteristic, and is operable at a high speed like the mirror load type differential amplifier.

What is claimed is:

1. A sense amplifier comprising:
   a first Schmitt trigger circuit comprising a first MOS transistor of the first polarity connected between a first power source potential and a first output terminal, second and third MOS transistors of the second polarity, the source-drain paths of said second and third MOS transistors being inserted in series between said first output terminal and a second power source potential, the gates of said second and third MOS transistors being connected together and to a first input terminal to be coupled for reception with a first input potential, and a fourth MOS transistor of the second polarity of which the source-drain path is inserted between said first power source potential and a node between the source-drain paths of said second and third MOS transistors, the gate of said fourth MOS transistor being connected to said first output terminal;
   a second Schmitt trigger circuit comprising a fifth MOS transistor of the first polarity connected between said first power source potential and a second output terminal, sixth and seventh MOS transistors of the second polarity, the source-drain paths of said sixth and seventh MOS transistors being inserted in series between said second output terminal and said second power source potential, the gates of said sixth and seventh MOS transistors being connected together and to a second input terminal to be coupled for reception with a second input potential, and an eighth MOS transistor of the second polarity whose source-drain path is inserted between said first power source potential and a node between the source-drain paths of said sixth and seventh MOS transistors, the gate of said eighth MOS transistor being connected to said second output terminal;
   the gate of said first MOS transistor in said first Schmitt trigger circuit being connected to said node between the source-drain paths of said sixth and seventh MOS transistors; and
   the gate of said fifth MOS transistor in said second Schmitt trigger circuit being connected to said node between the source-drain paths of said second and third MOS transistors.

2. A sense amplifier according to claim 1, in which the gate of said first MOS transistor is connected to said second output terminal in said second Schmitt trigger circuit, and the gate of said fifth MOS transistor is connected to said first output terminal in said first Schmitt trigger circuit.

3. A sense amplifier according to claim 2, which further comprises another sense amplifier connected at the output terminals to said first and second input terminals of said first and second Schmitt trigger circuits, said another sense amplifier not containing hysteresis or an insensitive zone characteristic.

4. A sense amplifier according to claim 3, in which said another sense amplifier is a mirror load type differential amplifier.

5. A sense amplifier according to claim 1, which further comprises another sense amplifier connected at the output terminals to said first and second input terminals of said first and second Schmitt trigger circuits, said another sense amplifier not containing hysteresis or an insensitive zone characteristic.

6. A sense amplifier according to claim 5, in which said another sense amplifier is a mirror load type differential amplifier.

* * * * *

UNITED STATES PATENT AND TRADEMARK OFFICE
CERTIFICATE OF CORRECTION

PATENT NO. : 4,616,148

DATED : October 7, 1986

INVENTOR(S) : Kiyofumi Ochii et al.

It is certified that error appears in the above-identified patent and that said Letters Patent is hereby corrected as shown below:

On the cover page, please change the address in [73[ to
-- Kawasaki-shi --

Signed and Sealed this

Tenth Day of March, 1987

Attest:

DONALD J. QUIGG

Attesting Officer

Commissioner of Patents and Trademarks